US009823306B2

(12) United States Patent
Murthy et al.

(10) Patent No.: US 9,823,306 B2
(45) Date of Patent: Nov. 21, 2017

(54) MEASURING INTERNAL SIGNALS OF AN INTEGRATED CIRCUIT

(71) Applicant: Texas Instruments Incorporated, Dallas, TX (US)

(72) Inventors: Kushal D Murthy, Bangalore (IN); Manish Parmar, Bangalore (IN); Preetam Tadeparthy, Bangalore (IN); Muthusubramanian Venkateswaran, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 15/042,132

(22) Filed: Feb. 11, 2016

(65) Prior Publication Data

US 2017/0234926 A1 Aug. 17, 2017

(51) Int. Cl.
  *G01R 31/28* (2006.01)
  *G01R 31/3177* (2006.01)
  *G01R 31/317* (2006.01)
  *H03K 19/0948* (2006.01)
  *H01L 21/66* (2006.01)

(52) U.S. Cl.
  CPC ..... *G01R 31/3177* (2013.01); *G01R 31/2884* (2013.01); *G01R 31/31723* (2013.01); *H01L 22/14* (2013.01); *H01L 22/34* (2013.01); *H03K 19/0948* (2013.01)

(58) Field of Classification Search
  None
  See application file for complete search history.

(56) References Cited

U.S. PATENT DOCUMENTS

| 5,164,663 A | 11/1992 | Alcorn |
| 5,541,935 A | 7/1996 | Waterson |
| 5,592,493 A * | 1/1997 | Crouch ............ G01R 31/31853 324/73.1 |
| 6,703,860 B1 * | 3/2004 | Agrawal .......... H03K 19/17736 326/38 |
| 7,688,240 B2 | 3/2010 | Jain et al. |

(Continued)

FOREIGN PATENT DOCUMENTS

EP  1118938  7/2001

OTHER PUBLICATIONS

"Joint Test Action Group", Wikipedia, pp. 1-15, from https://en.wikipedia.org/wiki/Joint_Test_Action_Group on Nov. 20, 2015.

(Continued)

*Primary Examiner* — Daniel McMahon
(74) *Attorney, Agent, or Firm* — John R. Pessetto; Charles A. Brill; Frank D. Cimino

(57) ABSTRACT

An integrated circuit (IC) is provided with functional logic having a plurality of internal signal lines and test logic. The test logic has a plurality of inputs coupled to the plurality of internal signal lines and with an output coupled to a first external pin of the integrated circuit. The test logic includes a buffer, and the test logic is configured to selectively couple each of the signals received on the plurality of signal lines either directly or via the buffer to the first external pin of the IC. The test logic is configured to selectively couple a signal received on a second external pin of the IC either via the buffer to the first external pin of the IC in order to calibrate the buffer.

7 Claims, 2 Drawing Sheets

(56) References Cited

U.S. PATENT DOCUMENTS

2005/0237785 A1* 10/2005 Venca .................. G11B 5/02
                                                    365/154
2006/0294312 A1* 12/2006 Walmsley ............ H04L 9/0662
                                                    711/122
2008/0243021 A1* 10/2008 Causevic ............ A61B 5/0002
                                                    600/544

OTHER PUBLICATIONS

"CD4067B, CD4097B Types", CMOS Analog Multiplexers/Demultiplexers, Texas Instruments, data sheet from Harris Semiconductor, SCHS052B, Revised Jun. 2003, pp. 1-17.
International Search Report from corresponding PCT Application No. PCT/US2017/017743, dated May 25, 2017 (3 pages).

* cited by examiner

MEASURING INTERNAL SIGNALS OF AN INTEGRATED CIRCUIT

FIELD OF THE INVENTION

This disclosure relates to testing of integrated circuits, and in particular to measuring internal analog signals.

BACKGROUND OF THE INVENTION

Semiconductor products are mass produced by fabricating circuitry on wafers in large factories called "fabs". Electronic circuits are gradually created on a wafer made of pure semiconducting material. Typically, the wafers are silicon based, but other types of materials, such as Gallium Arsenide, Gallium Nitride, Silicon Carbide, etc. may also be used for special applications. In semiconductor device fabrication; the various processing steps typically fall into four general categories; deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD), among others.

Removal is any process that removes material from the wafer; examples include etch processes (either wet or dry) and chemical-mechanical planarization (CMP).

Patterning is the shaping or altering of deposited materials, and is generally referred to as lithography. For example, in conventional lithography, the wafer is coated with a chemical called a photo-resist; then, a machine called a stepper focuses, aligns, and moves a mask, exposing select portions of the wafer below to short wavelength light; the exposed regions are washed away by a developer solution. After etching or other processing, the remaining photo-resist is removed by plasma etching.

Modification of electrical properties has historically entailed doping transistor sources and drains. This is typically done by diffusion furnaces or by ion implantation. These doping processes are followed by furnace annealing; in advanced devices, rapid thermal annealing (RTA) may be performed. Annealing serves to activate the implanted dopants. Modification of electrical properties may be performed using other techniques, such as by reducing a material's dielectric constant in low-k insulators via exposure to ultraviolet light in UV processing (UVP), for example.

BRIEF DESCRIPTION OF THE DRAWINGS

Particular embodiments in accordance with the invention will now be described, by way of example only, and with reference to the accompanying drawings.

Figure 1:
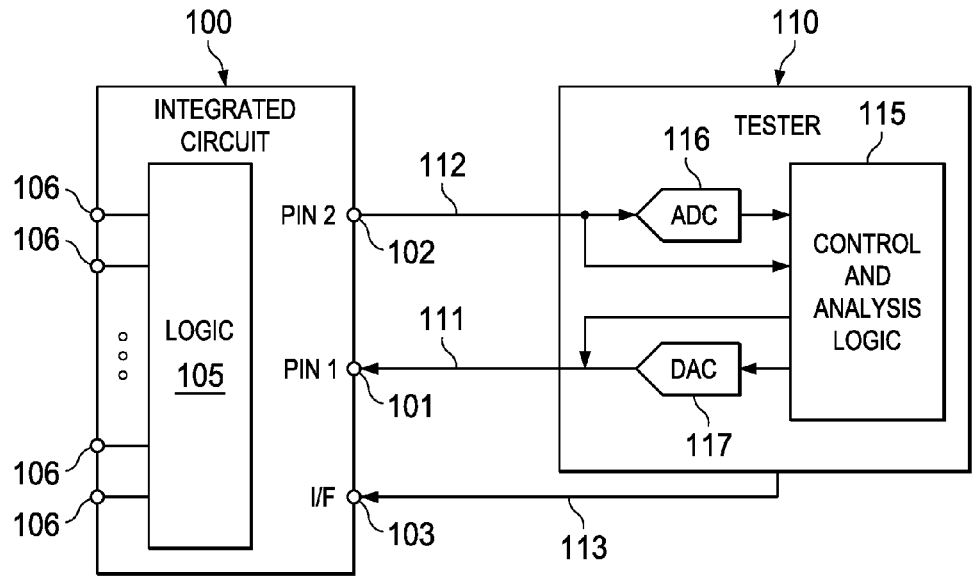
FIG. 1 is a block diagram illustrating an integrated circuit (IC) coupled to a tester.

Other features of the present embodiments will be apparent from the accompanying drawings and from the detailed description that follows.

DETAILED DESCRIPTION OF EMBODIMENTS OF THE INVENTION

Specific embodiments of the disclosure will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

After a batch of wafers is completed and tested, the good devices resulting from that step are typically packaged and then tested again after the packaging process. In some cases, there may be multiple probe test steps and/or multiple package test steps. The steps used to produce the wafers and packaged devices are very complicated and the complexity grows with each subsequent generation of semiconductor technology. There are many opportunities for simple errors and complex interactions in the manufacturing process which can lead to the creation of defective devices.

Embodiments of this disclosure may provide flexibility to allow a tester to select a signal for testing from a group of internal signals and selectively buffer or not buffer the selected internal signal before bringing it to an external pin accessible to the tester.

Bringing out the internal signals directly on an external pin for testing is not possible in every case due to several factors, such as: the total number of signals, drive strength, and compensation reasons. A multiplexor circuit may be used to allow selection of a large number of signals that may be provided to a single external pin for testing.

Coupling a selected internal signal directly to external pin 102 may be needed for many reasons. One reason is to accurately measure and trim the signal. For example, Bandgap voltage, where an accuracy of a few microvolts may be important and it would not be desired to have the measurement distorted by buffer.

Another reason for using a direct connection to access an internal signal is that a buffer may actually kill small oscillations, if they exist, on the selected signal. For cases where the designer or test engineer needs to measure the stability or ringings of an internal signal, a direct signal connection may be needed.

Another reason for using a direct connection to access an internal signal is that some internal signals may need to be tested for evaluating the driving strength of an internal driver. A direct connection to the signal may be needed to perform a drive strength test.

Another reason for using a direct connection to access an internal signal is to ensure that the test path is not getting corrected or obscured by an environment inside or outside chip. A direct path helps to verify the path accuracy.

However, some signals may need to be buffered before bringing them to an external pin. For example, a particular internal signal path may be very slow and not have adequate drive strength to drive the internal signal off-chip. Therefore, some signals may be routed directly via the multiplexor to an external pin while others may need to be brought out through a second multiplexor to a unity gain buffer, for example. This buffer shouldn't add any error to the signal getting measured and should be capable of swinging rail to rail so that signals of any common mode may be brought out through the buffer.

This amplifier may only be used once during the testing of a part and not in regular operation of IC; therefore it may be considered an overhead on the chip. This buffer is usually calibrated to cancel the offset at VDD/2 before making any measurement. Though offset is canceled, a gain error may still remain.

Currently, the classification of a signal into high or low impedance and whether or not it is sensitive to output parasitic capacitance needs to be done at the design stage of the semiconductor product so that a decision can be made to route it a first multiplexor circuit directly to an external test pin via or to a second multiplexor and then through buffer coupled to the external test pin.

An embodiment of this disclosure may provide a low area solution that is capable of bringing out a signal at any common mode without gain or offset errors and be flexible enough to bring out signals having a range impedance and output capacitance sensitivity, as will be described in more detail below.

FIG. 1 is a block diagram illustrating an exemplary integrated circuit (IC) 100 coupled to a tester 110. IC 100 is representative of a wide range of semiconductor devices that include logic circuitry 105 coupled to one or more external pins 106. Digital integrated circuits may contain anywhere from one to millions of logic gates, flip-flops, multiplexers, and other circuits in a few square millimeters. The small size of these circuits allows high speed, low power dissipation, and reduced manufacturing cost compared with board-level integration. Digital ICs, typically microprocessors, DSPs, and microcontrollers, work using binary mathematics to process "one" and "zero" signals. Digital ICs may be further sub-categorized as logic ICs, memory chips, interface ICs (level shifters, serializer/deserializer, etc.), Power Management ICs, and programmable devices.

Analog ICs, such as sensors, power management circuits, and operational amplifiers, work by processing continuous signals. They perform functions like amplification, active filtering, demodulation, and mixing. Analog ICs ease the burden on circuit designers by having expertly designed analog circuits available instead of designing a difficult analog circuit from scratch. Analog ICs may be further sub-categorized as linear ICs and RF ICs.

ICs can also combine analog and digital circuits on a single chip to create functions such as A/D converters and D/A converters. Such mixed-signal circuits offer smaller size and lower cost, but must carefully account for signal interference. Mixed-signal integrated circuits may be further sub-categorized as data acquisition ICs (including A/D converters, D/A converter, digital potentiometers) and clock/timing ICs, for example.

The design and fabrication of these various types of ICs are well known and need not be described in further detain herein.

As mentioned above, pins 106 provide access points for various signals that are input or output to and/or from IC logic 105. However, in order to properly test IC 100 after production to assure that it is functioning correctly may require access to signals that remain internal within IC logic 105. In order to provide a higher level of testing, IC designers may allocate a few external pins for access by a tester, such as tester 110. These pins may be dedicated pins that are only used for testing. Alternatively, they may be dual purpose pins in which IC 100 may be placed in a test mode that allocates the pins for testing, but during normal operation the pins are used for functional signals, for example.

A complex IC may allocate a few external pins to support testing of the internal logic circuitry by an external tester, such as tester 110. Several test interfaces have been standardized and are now used by a number of manufactures. For example, a typical debug interface may utilize a "JTAG" (Joint Test Action Group) interface that is the common name for the IEEE 1149.1 Standard Test Access Port and Boundary-Scan Architecture. JTAG is widely used for IC (integrated circuit) debug ports. In the embedded processor market, essentially all modern processors implement JTAG when they have enough pins.

To provide the boundary scan capability, IC vendors add additional logic to each of their devices, including scan cells for each of the external traces. These cells are then connected together to form the external boundary scan shift register (BSR), and combined with JTAG TAP (Test Access Port) controller support comprising four (or sometimes more) additional pins plus control circuitry.

Some TAP controllers support scan chains between on-chip logical design blocks, with JTAG instructions which operate on those internal scan chains instead of the BSR. This can allow those integrated components to be tested as if they were separate chips on a board. On-chip debugging solutions are heavy users of such internal scan chains.

For normal operation, the added boundary scan latch cells may be set so that they have no effect on the circuit, and are therefore effectively invisible. However, when the circuit is set into a test mode, the latches enable a data stream to be shifted from one latch into the next. Once a complete data word has been shifted into the circuit under test, it can be latched into place so it drives external signals. Shifting the word also generally returns the input values from the signals configured as inputs.

However, JTAG is not suitable for use in testing of analog signals that are internal to an IC because analog signals are not amenable to be transferred through a scan chain.

Referring still to FIG. 1, IC 100 includes two external pins 101, 102 that may be used for testing analog signals internal to IC 100. One or more additional pins 103 may be required to provide an interface for test commands provided by a tester, as will be explained in more detail below.

Tester 110 is representative of various types of testers that may be used in a lab environment or in a production environment to evaluate ICs during development or to test ICs during production. Tester 110 includes control and analysis logic 115 that may be configured by a human operator or a predefined test program to request access to various internal signals within IC 100 by sending control commands over command bus 113 that is connected to the IC interface pins 103. The requested signal may be accessed via signal line 112 that is coupled to external pint 102 of IC 100. Signal line 111 is coupled to external pin1 101 of IC 100 and may be used for calibration, as will be described in more detail later.

Tester 110 may include one or more analog to digital converters 116 to convert an analog signal obtained from IC 100 to a digital signal that may be analyzed by tester logic 115, for example. Similarly, tester 110 may include one or more digital to analog converters 117 that may be used to generate a precision analog signal for use in calibration of the test setup, as will be explained in more detail below.

Command bus 113 may include one or more signal lines which may be used for an industry standard protocol or for a proprietary protocol. For example, I$^2$C (Inter-Integrated Circuit) is a multi-master, multi-slave, single-ended, serial computer bus that may be used for this purpose. It is typically used for attaching lower-speed peripheral ICs to processors and microcontrollers. I$^2$C uses only two bidirectional open-drain lines, Serial Data Line (SDA) and Serial Clock Line (SCL), pulled up with resistors. Typical voltages used are +5 V or +3.3 V although systems with other voltages are permitted. The I$^2$C reference design has a 7-bit or a 10-bit (depending on the device used) address space. Common I²C bus speeds are the 100 Kbit/s standard mode and the 10 Kbit/s low-speed mode, but arbitrarily low clock frequencies are also allowed.

Figure 3:
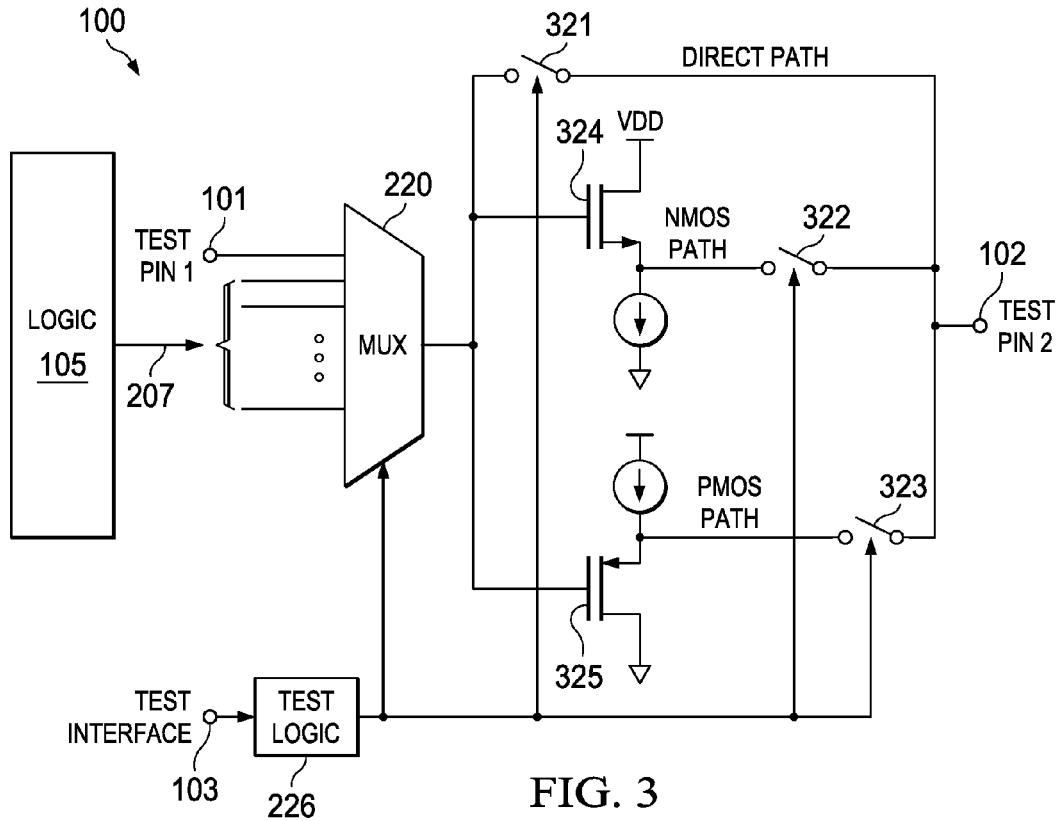
FIGS. 2 and 3 are more detailed block diagrams of the IC of FIG. 1 illustrating selective circuitry for accessing internal signals.
Figure 2:
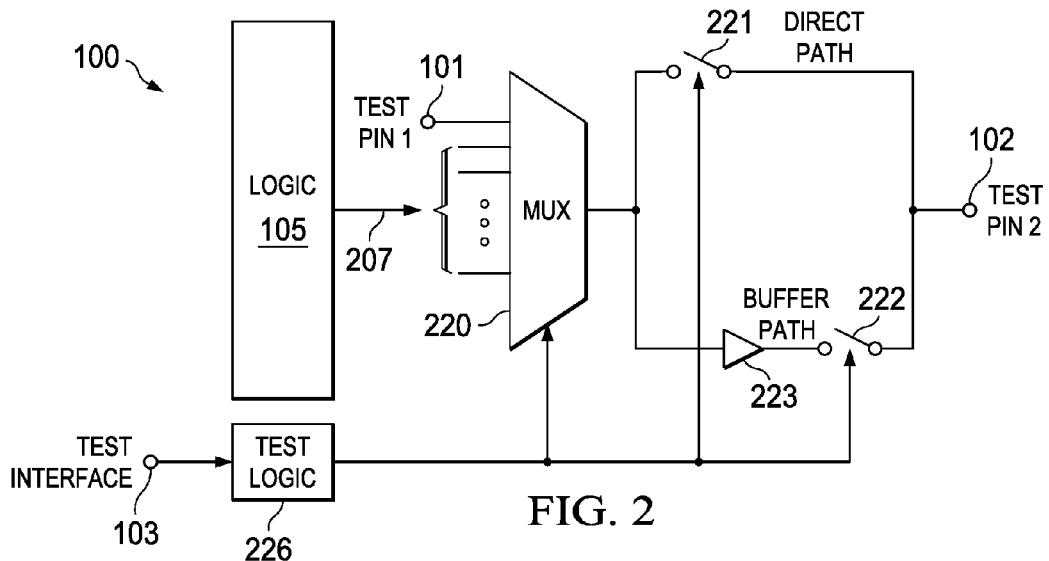

FIGS. 2 and 3 are more detailed block diagrams of IC 100 illustrating selective circuitry for accessing internal signals. Multiplexor 220 may have a few inputs or several hundred inputs, depending on the complexity of IC logic 105. During the design of 100, a design team may indentify a set of signals 207 that may be useful for testing of IC logic 105. All of the signals in this set may be coupled to inputs on multiplexor 220 without regard to their signal strength or impendence level.

In this example, mux 220 is a digitally controlled analog multiplexor. The design of such analog multiplexors is well known and need not be described in detail. For example, Texas Instruments, Inc. offers digitally controlled analog muxs, such as CD4067B single ended or CD4097B differential devices. These devices provide an ON resistance of approximately 125 ohms, for example. A similar analog mux design may be offered in an IC design library, for example.

FIG. 2 illustrates an embodiment in which a direct path from the output of mux 220 to external pin 102 may be enabled by switch 221. Alternatively, the output of mux 220 may be routed through a buffer 223 by enabling switch 222 and disabling switch 221. Typically, buffer 223 may be a unity gain buffer; however, in some embodiments buffer 223 may have a gain that is greater than one in order to amplify low amplitude signals for the tester or a gain of less than one in order to reduce the amplitude of high voltage signals, for example.

FIG. 3 illustrates another embodiment in which a direct path from the output of mux 220 to external pin 102 may be enabled by switch 321. Alternatively, the output of mux 220 may be routed through an NMOS buffer 324 by enabling switch 322 and disabling switch 321 for a signal that is referenced to the Vdd supply. Alternatively, the output of mux 220 may be routed through a PMOS buffer 325 by enabling switch 323 and disabling switch 322 for a signal that is referenced to the ground supply. Typically, NMOS buffer 324 may be selected to buffer signals that have an amplitude in a range of approximately a supply reference (Vdd) to a first threshold value, such as Vdd/2. Typically PMOS buffer 325 may be selected to buffer signals that have an amplitude in a range of approximately ground reference (Vss) to a second threshold value, such as Vdd/2. Signals that have an amplitude above a third threshold value and below Vdd-threshold value may be buffered by either the PMOS buffer 325 or NMOS buffer 324. The third threshold value may be approximately Vdd/4, for example. The threshold values may be selected by a test engineer based on design parameters of a given IC, for example.

Typically, buffers 324, 324 may be simple unity gain source follower buffers; however, in some embodiments buffer 224 and/or 325 may have a gain that is greater than one in order to amplify low amplitude signals for the tester or a gain of less than one in order to reduce the amplitude of high voltage signals, for example.

In another embodiment, additional buffers may be provided in order to provide a unity gain option and a non-unity gain option, for example. In this case, an external tester may send commands to specify which buffers to enable for a given selected internal signal, for example.

After the IC has been fabricated, it may be coupled to a tester such as tester 110. Tester logic 115 may execute a test program that sends a command to IC test logic 226 to select a particular one of the set of signals 207. IC test logic 226 controls mux 220 to transfer the requested signal to external signal pin 102. As mentioned above, some analog signals may need buffering while others do not.

The tester may be configured to send a command to IC test logic 226 to enable either a direct path from the output of mux 220 to external pin 102 via switch 221 or to enable a path through buffer 223 via switch 222. The tester may be aware of that the signal does not require buffering; in that case the tester may send a command to enable the direct path 221 to external pin 102. Alternatively, the tester may be aware of that the signal does require buffering; in that case the tester may send a command to enable the buffered path 222 to external pin 102. For example, a test engineer may have already evaluated a given type of IC and program the tester to know which signals need buffering and which signals do not need buffering.

In the case where the tester is not aware of the condition of the selected internal signal, the tester may first monitor the selected signal using the direct path. If there are no oscillations due to parasitic capacitive loading and the tester has a high impedance input such that there is no current load, then the selected signal may be directly measured. If unexpected oscillations are detected by the tester, the selected signal may need to be buffered by enabling the buffer path test pin2 102.

Referring to FIG. 3, depending on signal measured, the tester may decide to continue measuring on the NMOS path 324 or switch to PMOS path 325.

Prior to or during a test sequence, tester 110 may perform a calibration of test buffer 223 or 324/325. Calibration may be performed by sending a known calibration signal from tester 110 via DAC 117 to external pin 101, commanding mux 220 to select this calibration signal, enabling the buffer, and then comparing the resulting signal received at tester 110 to the known calibration signal provided by tester 110.

To improve accuracy, tester 220 may first select and measure a particular internal signal to determine its amplitude, and then perform a calibration using approximately the same amplitude for the known calibration signal. This may be done once, or it may be done for each internal signal that is selected for buffering, for example. In this manner, since the amplifier is calibrated close to the measured value of the signal there will be no gain or offset errors after the measured signal is compensated based on the calibration value and the area of the amplifier need not be large to make it accurate. Typically an op-amp is not needed; simple source followers such as illustrated in FIG. 3 at 324, 325 are adequate.

In another embodiment, calibration may be performed by sending a sequence of known calibration signals from tester 110 via DAC 117 to external pin 101, commanding mux 220 to select this calibration signal, enabling the buffer, and then comparing the resulting signal received at tester 110 to the known calibration signal provided by tester 110. In this case, the sequence of calibration signals may have amplitudes that range in value from one supply rail, such as Vss, to another supply rail, such as Vdd.

In this manner, a test module may be provided for a design library that is scalable to accommodate new signals since it is flexible for any signals irrespective of their common mode, drive strength, and stability. This makes it possible to develop the test mode paths in a new chip independently and prior to design of the chip without the knowledge of signals to be brought out.

In some embodiments, both analog and digital signals may be provided to mux 220. In other embodiments, only analog signals may be provided to mux 220 while digital signals are included in a scan path, for example. The scan path output may be shared with test pin1 and test pin 2, for example, or may be provided on a separate set of pins.

Figure 4:
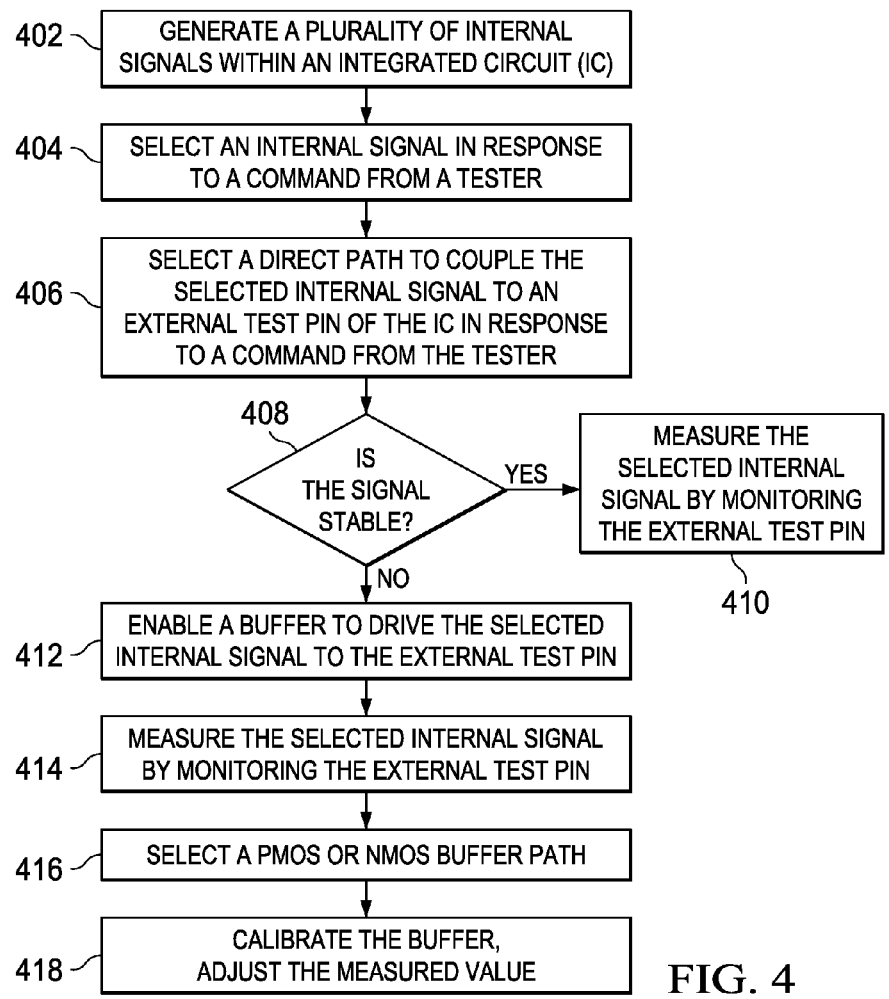
FIG. 4 is a flow diagram illustrating testing of an IC according to an embodiment of the disclosure.

FIG. 4 is a flow diagram illustrating testing of an IC according to an embodiment of the disclosure. Referring back to FIGS. 2 and 3, a plurality of internal signals may be generated 402 within the functional logic 105 of an integrated circuit 100, These internal signals may all be provided to multiplexor 220. During a testing phase, a tester 110 may be coupled to the IC to access an input test pin 101 output test pin 102, and interface pin(s) 103.

Tester 110 may send a command to interface pins 103 to configure mux 220 to select 404 an internal signal and cause it to be coupled to output pin 102. Tester 110 may monitor output pin 102 to determine if the selected internal signal is stable 408. If the signal is stable, then the tester may measure 410 the signal by monitoring the output pin.

If the selected internal signal is not stable 408, then the tester may send another command to the interface pins 103 to enable 412 the selected internal signal to be routed through a buffer 223 or 324/325 to external pin 102.

The tester may then measure 414 the internal signal by monitoring output pin 102.

Tester 110 may elect to calibrate 418 the buffer by measuring 414 the amplitude of the selected internal signal presently on output pin 102, then sending a known calibration signal that is approximately equal in amplitude to input pin 101 and then sending a command to interface 103 to cause mux 220 to select the known calibration signal and couple it to output pin 102 via buffer 223 or 324/325. The tester may then measure the resulting calibration signal on output pin 102 and use this calibrated amplitude to correct the amplitude measured in step 414.

The calibration step may be performed for each selected internal signal, or it may be performed once and the results used for other selected internal signals.

Referring again to FIG. 3, in some embodiments there may be more than one buffer option, such as PMOS buffer 324 and NMOS buffers 325. In this case, the tester may first measure 414 the selected first internal signal, determine what its common mode is, and then select 416 the buffer that is most appropriate for that common mode.

This process may be repeated in order to select and measure all of the internal signals that are provided to mux 220. Typically, these signals will be analog, but digital signals may also be monitored in this manner. Alternatively, a scan chain protocol, such as JTAG, may share the test pins and be used for accessing digital signals.

Other Embodiments

While the invention has been described with reference to illustrative embodiments, this description is not intended to be construed in a limiting sense. Various other embodiments of the invention will be apparent to persons skilled in the art upon reference to this description. For example, while various types of standardized test and communication protocols such as JTAG and I2C were discussed herein, embodiments of the disclosure may be made using other known or later developed standard protocols or using vendor specific proprietary protocols.

While a single buffer or a pair of unity gain buffers are illustrated herein, other embodiments may use other types of known or later developed buffers, op amps or other types of buffering circuits to condition an internal signal prior to coupling it to an external pin for testing.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for testing an integrated circuit, the method comprising:
    generating a plurality of internal signals within the integrated circuit (IC);
    selecting a first internal signal from the plurality of internal signals in response to a command from an external test station;
    coupling the first internal signal to a first external pin of the IC either directly or via a buffer circuit located within the IC in response to a command from the external test station; and
    measuring the first internal signal by the external test station by monitoring the first external pin of the IC to produce a measured value;
    further including calibrating the buffer circuit by:
    providing a known calibration signal to a second external pin of the IC;

coupling the known calibration signal to the first external pin of the IC via the buffer circuit in response to a command from the external test station; and measuring the known calibration signal after it is buffered by monitoring the first external pin of the IC by the external test station to produce a calibration value.

2. The method of claim 1, further including adjusting the measured value of the first internal signal using the calibration value.

3. The method of claim 1, in which a plurality of calibration signals are provided to the second external pin.

4. The method of claim 3, in which the plurality of calibration signals have amplitudes that range in value from a first supply voltage level of the IC to a second supply voltage level of the IC.

5. A method for testing an integrated circuit, the method comprising:

generating a plurality of internal signals within the integrated circuit (IC);

selecting a first internal signal from the plurality of internal signals in response to a command from an external test station;

coupling the first internal signal to a first external pin of the IC either directly or via a buffer circuit located within the IC in response to a command from the external test station; and measuring the first internal signal by the external test station by monitoring the first external pin of the IC to produce a measured value;

further including:

determining a common mode of the first internal signal; and selecting from among more than one buffer to couple the first internal signal to the first external test pin in accordance with the common mode of the first internal signal.

6. The method of claim 5, in which a first one of the buffers is a PMOS source follower, and in which a second one of the buffers is an NMOS source follower.

7. The device of claim 6, in which the PMOS source follower is selected for buffering signals having an amplitude in a range of approximately a threshold value to a ground reference value, and in which the NMOS source follower is selected for buffering signals having an amplitude in a range of approximately a threshold value to a supply reference value.

* * * * *